(12) United States Patent
Mahooti

(10) Patent No.: US 7,764,135 B2
(45) Date of Patent: Jul. 27, 2010

(54) PULSE SHAPING CIRCUIT FOR CRYSTAL OSCILLATOR

(75) Inventor: Kevin Mahooti, Sunnyvale, CA (US)

(73) Assignee: NXP B.V., Eindhoven (NL)

( * ) Notice: Subject to any disclaimer, the term of this patent is extended or adjusted under 35 U.S.C. 154(b) by 199 days.

(21) Appl. No.: 12/282,281

(22) PCT Filed: Mar. 8, 2007

(86) PCT No.: PCT/IB2007/050781

§ 371 (c)(1),
(2), (4) Date: Sep. 9, 2008

(87) PCT Pub. No.: WO2007/105153

PCT Pub. Date: Sep. 20, 2007

(65) Prior Publication Data

US 2009/0039972 A1  Feb. 12, 2009

Related U.S. Application Data

(60) Provisional application No. 60/781,236, filed on Mar. 10, 2006.

(51) Int. Cl.
*H03B 5/00* (2006.01)

(52) U.S. Cl. .................. 331/74; 331/160; 331/158; 713/501

(58) Field of Classification Search ............ 331/74, 331/158, 160; 713/501
See application file for complete search history.

(56) References Cited

U.S. PATENT DOCUMENTS

| 5,113,098 | A | 5/1992 | Teymouri | |
|---|---|---|---|---|
| 5,606,293 | A | * 2/1997 | Matsui et al. | 331/74 |
| 5,999,044 | A | 12/1999 | Wohlharth et al. | |
| 6,061,804 | A | 5/2000 | Hirai | |
| 6,084,482 | A | * 7/2000 | Nakamura | 331/44 |
| 6,191,659 | B1 | * 2/2001 | Daanen et al. | 331/74 |
| 6,639,434 | B1 | 10/2003 | Rahman | |
| 6,943,588 | B1 | 9/2005 | Luo et al. | |
| 2002/0113643 | A1 | 8/2002 | La Rosa | |
| 2006/0103481 | A1 | * 5/2006 | Lin | 331/158 |

FOREIGN PATENT DOCUMENTS

| EP | 0338517 A | 10/1989 |
|---|---|---|
| EP | 0690570 A | 1/1996 |
| JP | 05299985 A | 11/1993 |

OTHER PUBLICATIONS

Driscoll et al; "Voltage Comparator Circuit". IP.Com Journal, IP.Com Inc., West Henrietta, NY, US. Sep. 1, 1974. The Whole Document.

Jedec Standard—"Scalable Low-Voltage Signaling for 400 mV (SLVS-400)", JESD8-13, Oct. 2001.

Pravas Pardhan and Jeff Ju, Fairchild Semiconductor, "Low-Power Differential Interface Technologies for Portable Products", EDN Europe, Apr. 2005.

* cited by examiner

*Primary Examiner*—Joseph Chang

(57) ABSTRACT

A circuit arrangement and method utilize a variable threshold, multi-stage pulse shaping circuit to pulse shape a signal output by a crystal oscillator circuit. Each stage of the pulse shaping circuit includes a Schmitt trigger that drives an input of a latch, and that has a programmable trip point controlled to reject distorted pulses generated by the crystal oscillator circuit. A variable threshold, multi-stage pulse shaping circuit may be used, for example, to generate a clock signal for an electronic circuit that is more resistant to noise and other environmental effects, thereby reducing the likelihood of clock-related errors in the electronic circuit.

24 Claims, 4 Drawing Sheets

PULSE SHAPING CIRCUIT FOR CRYSTAL OSCILLATOR

The invention is generally related to methods and circuit arrangements for generating clock signals with a crystal oscillator.

Crystal oscillators are used to generate electrical signals with extremely precise frequencies. The electrical signals generated by crystal oscillator circuits are used in a number of applications requiring precise time references, such as to keep track of time in wristwatches, to provide a stable clock signal for digital integrated circuits, and to stabilize frequencies for radio transmitters.

Particularly when crystal oscillator circuits are used to generate clock signals for digital integrated circuits, special care must be taken to ensure that the clock signals are steady and precise, as distortions or irregularities in such clock signals can lead to indeterminate results and/or data corruption.

Crystal oscillator circuits are often designed with circuitry that desirably guarantees start up, controls the oscillation amplitude, limits power consumption, and reduces EMI noise. However, even by applying the best design practices in these areas, there is no guarantee of proper functionality at all times, particularly when a crystal oscillator is used in a harsh environment such as one where the crystal pins, case, or body can be touched, shorted to ground or to supply, or even where the crystal itself can be removed from the circuit.

In these cases, due to the distortion induced in the crystal oscillator's amplitude and duration, a crystal oscillator circuit often emits cycles with an extremely short time period between successive rising and falling edges. If such an output is used as the clock for a microcontroller or microprocessor, which typically have a minimum pulse width that can be accepted, the microcontroller or microprocessor may not execute instructions properly. As a result, the microcontroller or microprocessor may lose track of the program it is running and jump to unexpected memory addresses. This can, in turn, result in the microcontroller or microprocessor overwriting memory locations that contain vital data or program code.

Clock generation circuits have been developed to improve the precision and stability of a clock signal emanating from a crystal oscillator circuit. For example, circuits have been developed to address start up conditions and ensure than an oscillator will start up at power on. Circuits have also been developed to better control amplitude and oscillation frequency. Circuits have also been developed to reduce power consumption through the use of a reduced internal supply. However, in many of these instances, no provision has been made for addressing the effects of harsh environments on a crystal oscillator.

In addition, in many of these instances, the resulting circuits are highly frequency dependent due to the use of passive filtering implemented through a resistor/capacitor (RC) network, and are thus configured to work only with crystal oscillators that operate within a narrow range of frequencies.

A significant need therefore exists in the art for an improved manner of generating a stable and precise output signal from a crystal oscillator circuit that is less resistant to the effects of harsh environments and that is suitable for use over a wider frequency range.

The invention addresses these and other problems associated with the prior art by providing a circuit arrangement and method that utilize a variable threshold, multi-stage pulse shaping circuit to pulse shape a signal output by a crystal oscillator circuit. Each stage of the pulse shaping circuit includes a Schmitt trigger that drives an input of a latch, and that has a programmable trip point controlled to reject distorted pulses generated by the crystal oscillator circuit. A variable threshold, multi-stage pulse shaping circuit may be used, for example, to generate a clock signal for an electronic circuit that is more resistant to noise and other environmental effects, thereby reducing the likelihood of clock-related errors in the electronic circuit.

A variable threshold, multi-stage pulse shaping circuit consistent with the invention is configured to receive an input signal that is responsive to a crystal oscillator circuit and generate a pulse shaped signal therefrom. Such a pulse shaping circuit includes a plurality of stages, each of which including a latch and a Schmitt trigger coupled to an input of the latch, and with the Schmitt trigger in each stage having a programmable trip point.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

Embodiments consistent with the invention utilize a variable threshold, multi-stage pulse shaping circuit to pulse shape a signal output by a crystal oscillator circuit. Each stage of the pulse shaping circuit includes a Schmitt trigger that drives an input of a latch, and that has a programmable trip point controlled to reject distorted pulses generated by the crystal oscillator circuit. The pulse shaping circuit may therefore be used to eliminate narrow pulses from a crystal oscillator's output before the output is distributed to other circuits.

A variable threshold, multi-stage pulse shaping circuit as described herein may be used, for example, to generate a clock signal for an electronic circuit that is more resistant to noise and other environmental effects, thereby reducing the likelihood of clock-related errors in the electronic circuit. In other instances, a pulse shaping circuit may be used in other applications where a stable and precise time reference signal is desired.

Figure 1:
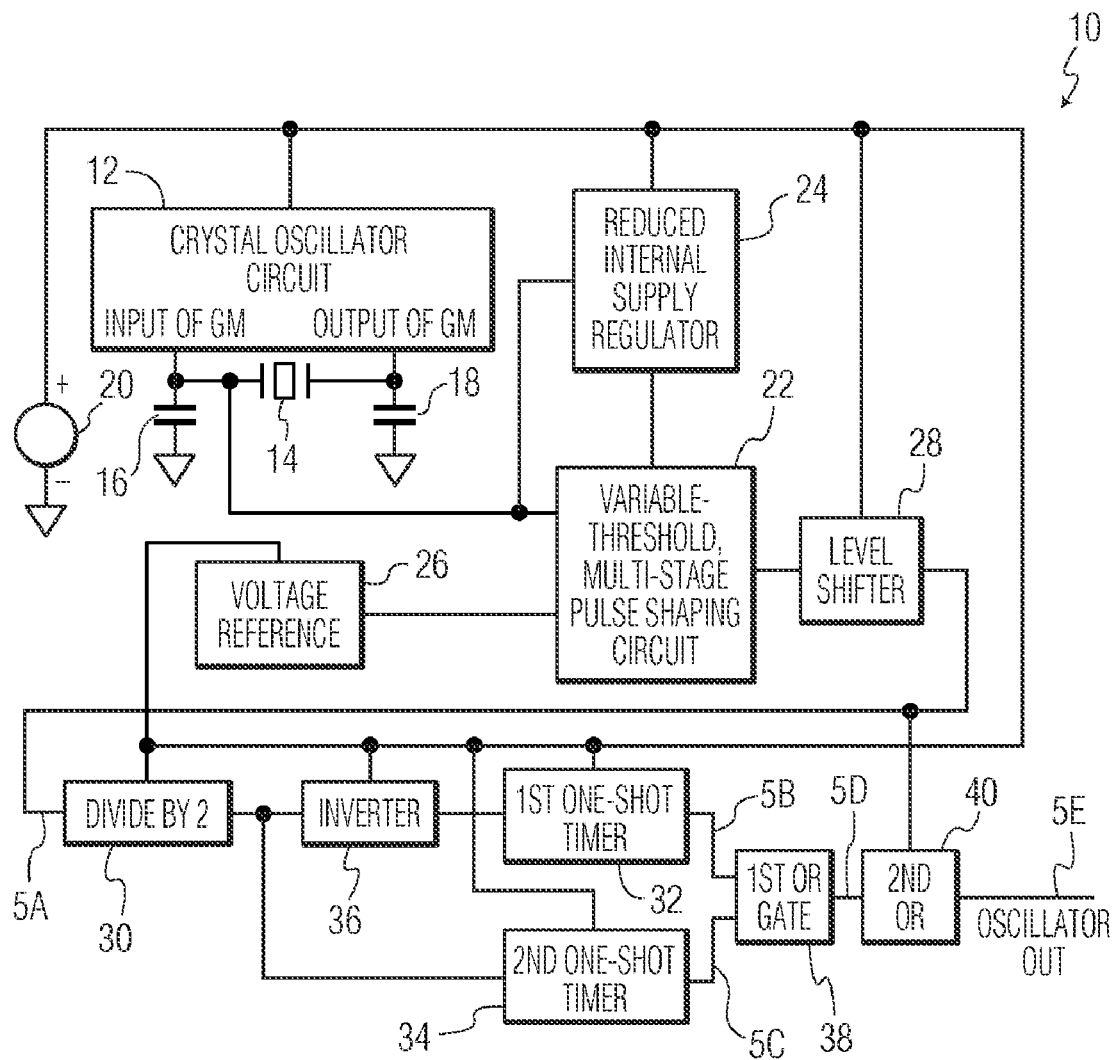
FIG. 1 is a block diagram of a circuit arrangement for generating a clock signal from a crystal oscillator and incorporating a pulse shaping circuit consistent with the invention.

Turning to the Drawings, wherein like numbers denote like parts throughout the several views, FIG. 1 illustrates a circuit arrangement 10 configured to generate a clock signal at an oscillator output thereof. Circuit arrangement 10 typically includes one or more integrated circuit devices and supporting circuitry therefor. Alternatively, circuit arrangement 10 may be implementing using discrete devices. While the invention has and hereinafter will be described in the context of circuit arrangements and data processing systems utilizing the same, those skilled in the art will appreciate that circuit arrangements consistent with the invention are also capable of being defined in a hardware definition language or other functional and/or physical definition of a circuit design, that such definitions may be distributed as program products in a variety of forms, and that the invention applies equally regardless of the particular type of computer readable media used to actually carry out the distribution. Examples of computer readable media include, but are not limited to tangible, recordable type media such as volatile and non-volatile solid state memory devices, floppy and other removable disks, hard disk drives, magnetic tape, optical disks (e.g., CD-ROMs, DVDs, etc.), among others, and transmission type media such as digital and analog communication links.

Circuit arrangement 10 is coupled to a crystal oscillator circuit 12 that drives a crystal 14 coupled between a transconductance (gm) input and output thereof, i.e., the input and output of a transconductance element within crystal oscillator circuit 12. Capacitors 16, 18 respectively tie the gm input and output of crystal oscillator circuit 12 to ground. It will be appreciated that a wide variety of crystals and crystal oscillator circuits may be used consistent with the invention. Indeed, due to the flexibility afforded by the herein described circuit arrangement, the circuit arrangement is readily suited for use with a wide variety of types of crystal oscillator circuits, e.g., having different output voltages, different resonant frequencies, etc. Typically, crystal oscillator circuit 12 is provided as a packaged component, although it will be appreciated that the functionality of circuit arrangement 10 and crystal oscillator circuit 12 may be combined into a common circuit in some embodiments.

In the illustrated embodiment, circuit arrangement 10 is coupled to crystal oscillator circuit 12 at the transconductance input. Put another way, the input of the transconductance element serves as the input signal to circuit arrangement 10. The input is used rather than the output in this embodiment since at start-up, as the amplitude of oscillation increases in crystal oscillator circuit 12, the input starts from zero and reaches its final value with a deterministic trajectory. It has been found that this deterministic trajectory facilitates selecting the appropriate level of trip points for each stage of the pulse shaping circuit discussed in greater detail below. In other embodiments, however, circuit arrangement 10 may receive an input signal that is obtained from other nodes in oscillator circuit 12, e.g., at the transconductance output thereof.

As shown in FIG. 1, circuit arrangement 10 and crystal oscillator circuit 12 are powered by an input supply voltage signal generated by a power supply 20. The input signal taken from the transconductance input of crystal oscillator circuit 12 is provided to a variable threshold, multi-stage pulse shaping circuit 22, which in turn outputs a pulse shaped signal based upon this input signal.

In the illustrated implementation, pulse shaping circuit 22 is powered by a reduced internal supply regulator 24 that receives the input supply voltage signal from power supply 20 (e.g., between about 1.8 VDC and about 5.5 VDC) and generates a reduced internal voltage (e.g., about 1.5 VDC) that is determined by the average DC voltage level of the pulse shaping circuit's input, i.e. the transconductance input of crystal oscillator circuit 12. By providing the transconductance input of crystal oscillator circuit 12, regulator 24 may be set to output a voltage to pulse shaping circuit 22 that is somewhat higher than the voltage level of the transconductance input after oscillation stabilizes and reaches its maximum value.

Pulse shaping circuit 22 also receives as an input a voltage reference signal from a voltage reference 26. The voltage reference signal is used to program the trip points for Schmitt triggers in the pulse shaping circuit (discussed below in connection with FIG. 3), and may be set to a fixed value that is appropriate for a particular crystal oscillator circuit. In particular, the trip point for each Schmitt trigger is typically set at sorting, and is not changed during normal operation. The trip point is programmable to make sure it could be set, if the design is used on different processes and/or in different temperature ranges. Since the transconductance input from crystal oscillator circuit 12 may be used as the input for pulse shaping circuit 22, based on different processes it may have a different final value. For example, for a crystal oscillator circuit with a single transistor gm stage, the threshold voltage of that transistor may be used as the final value. The voltage reference can be fixed in a number of manners consistent with the invention, e.g., via a voltage divider or other resistor network. In the illustrated embodiment, the voltage reference may be set, for example, to a nominal level of about 1 volt.

Pulse shaping circuit 22 outputs a pulse shaped signal that is provided to a level shifter 28, which restores the voltage level of the pulse shaped signal to the supply level. In embodiments where regulator 24 is not used, level shifter 28 may also be omitted.

The level shifted, pulse shaped signal output by level shifter 28, which takes the form of a pulse train, is then provided to a divide by two circuit 30, which may be implemented as a counter or other suitable circuit, and which generates an output signal with a fifty percent duty cycle. A pair of one-shot timers 32, 34 receive the output signal from divide by two circuit 30, with an inverter 36 coupled between divide by two circuit 30 and one-shot timer 32 such that one-shot timers 32, 34 synthesize both polarities of the pulse train. The duration of each one-shot timer is set such that the pulses output thereby are always longer than the minimum duration pulse to which any circuit that consumes the clock signal can respond, e.g., the minimum duration pulse capable of being processed by a microcontroller or microprocessor coupled to circuit arrangement 10.

A first OR gate 38 combines the outputs of one-shot timers 32, 34 together to generate a pulse with the same frequency of the crystal oscillator and a period longer than the minimum value that can be used by the microprocessor, microcontroller, or other circuit that is driven by the crystal oscillator. A second OR gate 40 combines this synthesized pulse train output by first OR gate 38 with the output pulse train from pulse shaping circuit 22, as adjusted by level shifter 28. Second OR gate 40 ensures that the minimum width of the pulse train grows as the oscillation amplitude grows, and reaches its maximum value as the oscillation amplitude stabilizes. Of note, each of devices 30, 32, 34, and 36 are powered by power supply 20.

Figure 2:
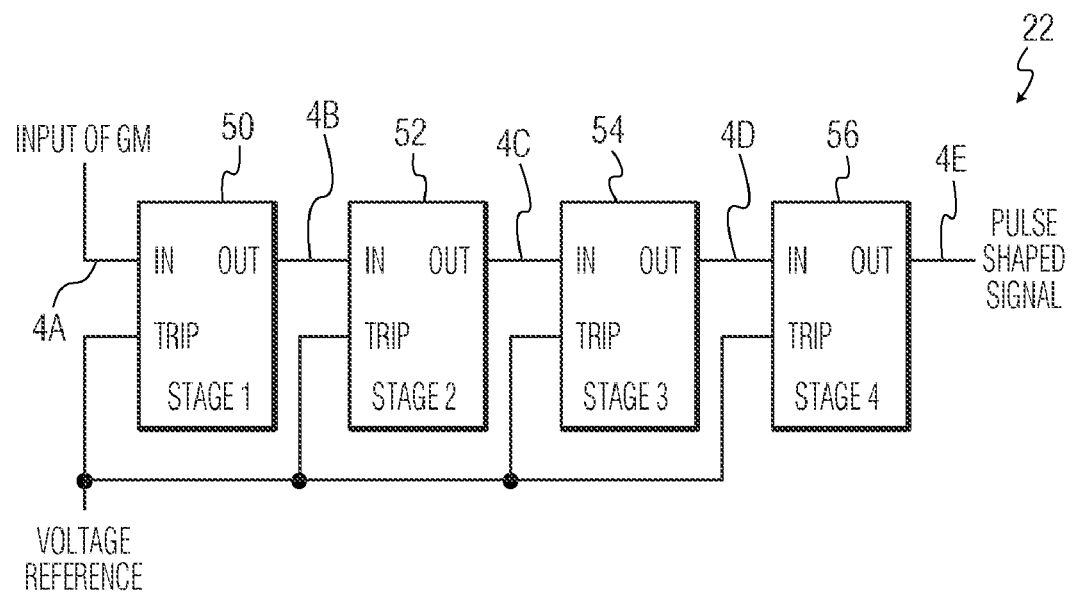
FIG. 2 is a block diagram of a four stage implementation of the pulse shaping circuit of FIG. 1.

FIG. 2 illustrates one implementation of pulse shaping circuit 22, incorporating four stages 50, 52, 54 and 56. Each stage 50, 52, 54, 56 has a signal input, a programmable trip point input and a signal output. The trip point input of each stage 50, 52, 54, 56 is coupled to voltage reference 26 (FIG. 1), although each stage could utilize a separate voltage reference in other embodiments. The signal input of first stage 50 is coupled to the transconductance input of crystal oscillator circuit 12 (FIG. 1), while the signal input of each successive stage 52, 54, 56 is coupled to the signal output of the preceding stage 50, 52, 54. The signal output of the last stage 56 provides the pulse shaped signal to level shifter 28 (FIG. 1).

Figure 3:
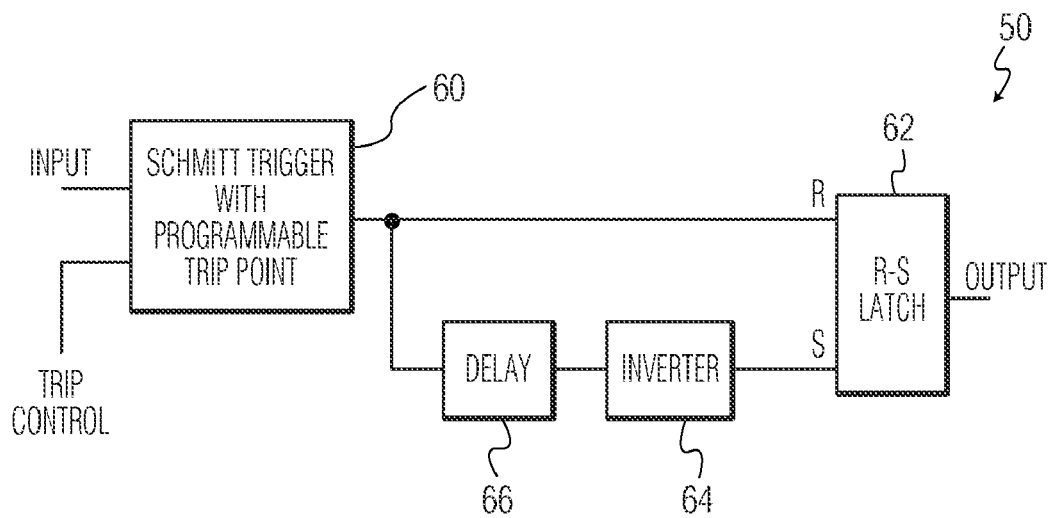
FIG. 3 is a block diagram of a stage from the pulse shaping circuit of FIG. 2.

FIG. 3 illustrates first stage 50 of pulse shaping circuit 22 in greater detail. It will be appreciated that stages 52, 54 and 56 may be similarly configured. Stage 50 includes a Schmitt trigger with programmable trip point circuit 60, with inputs that receive the signal and trip point control inputs for the stage. Schmitt trigger 60 outputs to the Reset input of an R-S latch 62, with the Set input of latch 62 coupled to the output of Schmitt trigger 60 via an inverter 64 and delay circuit 66. Delay circuit 66 is used to delay the transition of the Set input of latch 62 relative to the Reset input upon a transition in the output of Schmitt trigger 60, and may be set to a relatively minimal delay, e.g., about 20 ps to about 80 ps.

It will be appreciated that the inputs to latch 62 may be reversed in other embodiments, and that other latch implementations may be used. Other modifications and variations in stage 50 will be apparent to one of ordinary skill in the art having the benefit of the instant disclosure, and as such, the invention is not limited to the particular stage implementation illustrated in FIG. 3.

Returning to FIG. 2, pulse shaping circuit 22 is illustrated as including four stages. It will be appreciated, however, that circuit 22 may be implemented using less or more than four stages. For example, in some implementations it may be desirable to utilize between three and five stages.

Figure 4A:
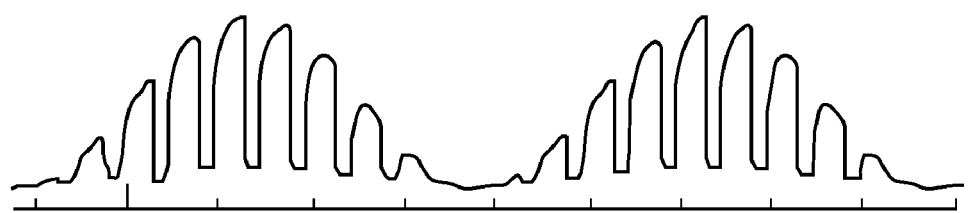
FIG. 4A is a signal waveform diagram of an exemplary signal generated at a transconductance input of a crystal oscillator circuit and provided as an input to the first stage of the pulse shaping circuit of FIG. 2.
Figure 4B:
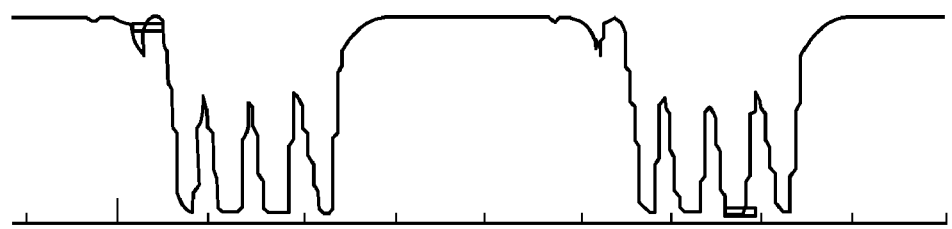
FIGS. 4B-4E are signal waveform diagrams respectively illustrating exemplary signals generated at the outputs of the first, second, third and fourth stages of the pulse shaping circuit of FIG. 2.
Figure 4C:
Figure 4D:
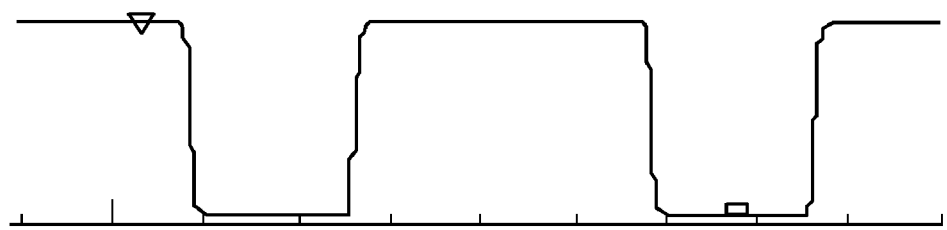
Figure 4E:
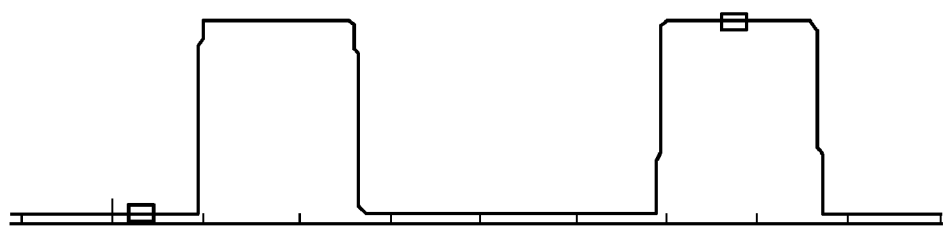

Each stage 50, 52, 54 and 56 of pulse shaping circuit 22 operates to reject a portion of the noise, i.e., short duration pulses, that may be encountered in the signal output by crystal oscillator circuit 12 (FIG. 1). FIG. 4A, for example, illustrates an exemplary signal generated at a transconductance input of crystal oscillator circuit 12 and provided as an input to stage 50 of pulse shaping circuit 22, taken at node 4A of FIG. 2. FIGS. 4B-4E, in turn, respectively illustrate the output of each of stages 50, 52, 54 and 56 (nodes 4B, 4C, 4D, and 4E of FIG. 2) based upon the input signal provided at node 4A. As can be seen from each of FIGS. 4B-4E, the noise in the input signal is progressively removed until, at node 4E, the pulse train is substantially free of noise.

Figure 5A:
FIG. 5A is a signal waveform diagram illustrating an exemplary signal provided as an input to the divide by two circuit referenced in FIG. 1.

Now turning to FIGS. 5A-5D, and with additional reference to FIG. 1, FIG. 5A illustrates an exemplary signal output from level shifter 28 and provided as an input to divide by two circuit 30 at node 5A. In this implementation, the signal at node 5A may be a level shifted version of the pulse shaped signal illustrated in FIG. 4E.

Figure 5B:
FIGS. 5B and 5C are signal waveform diagrams respectively illustrating exemplary signals generated at the outputs of the first and second one-shot timers referenced in FIG. 1.
Figure 5C:
Figure 5D:
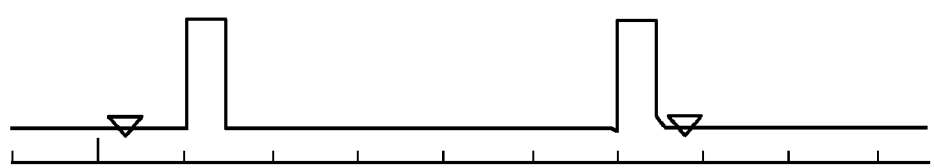
FIGS. 5D and 5E are signal waveform diagrams respectively illustrating exemplary signals generated at the outputs of the first and second OR gates referenced in FIG. 1.

FIGS. 5B and 5C respectively illustrate exemplary signals generated at the outputs of one-shot timers 32, 34 (nodes 5B and 5C of FIG. 1), while FIG. 5D illustrates an exemplary signal generated at the output of first OR gate 38 (node 5D of FIG. 1). As noted above, each one-shot timer 32, 34 is configured to output a pulse with a duration that exceeds a minimum duration pulse for the particular microprocessor, microcontroller or other circuit consuming the signal generated by circuit arrangement 10. Accordingly, the signal at node 5D has the same frequency as that output by pulse shaping circuit 22, with the width of each pulse exceeding the minimum required by the consumer circuit.

Figure 5E:

FIG. 5E illustrates an exemplary signal generated at the output of second OR gate 40 (node 5E of FIG. 1), which combines the signals illustrated in FIGS. 5A and 5D. It will be appreciated that, as crystal oscillator circuit 12 stabilizes, the width of the pulses output by pulse shaping circuit 22 will be greater than the width of the pulses output by one-shot timers 32, 34, and as such, the resulting signal at node 5E will typically closely mirror the signal at node 5A. On the other hand, if due to excessive noise the signal output by pulse shaping circuit 22 includes pulses with a shorter duration than the minimum required by the consumer circuit, the signal generated at node 5D will ensure that the minimum width parameter is still satisfied at the output at node 5E of circuit arrangement 10.

The aforementioned pulse shaping circuit, utilizing multiple stages running under a reduced internal voltage derived from the level of the signal being shaped, provides a number of advantages over conventional designs in terms of providing a stable and precise output signal, even under non-ideal conditions. The use of a Schmitt trigger with a programmable trip point, a delay unit and an R-S latch in each stage of the pulse shaping circuit moreover provides a low power, high speed circuit filter that may be used in a wide variety of pulse shaping applications and over a wide range of supply voltages and a wide range of frequencies, e.g., between about 20 KHz and about 20 MHz.

Various modifications may be made to the illustrated embodiments without departing from the spirit and scope of the invention. Therefore, the invention lies in the claims hereinafter appended.

The invention claimed is:

1. A circuit arrangement for generating a clock signal for an electronic circuit, wherein the electronic circuit is of the type having a minimum duration clock signal pulse width to which the electronic circuit is responsive, the circuit arrangement comprising:
   a crystal oscillator circuit configured to generate an input signal;
   a variable threshold, multi-stage pulse shaping circuit coupled to the crystal oscillator circuit and configured to generate a pulse shaped signal from the input signal, wherein the pulse shaping circuit includes a plurality of stages, each stage including:
      a Schmitt trigger having a programmable trip point coupled to a voltage reference;
      a latch having first and second inputs coupled to an output of the Schmitt trigger;
      a delay coupled intermediate the second input of the latch and the output of the Schmitt trigger; and
      a first inverter coupled intermediate the second input of the latch and the output of the Schmitt trigger;
   a divider circuit configured to frequency divide the pulse shaped signal;
   first and second one shot circuits coupled to an output of the divider circuit;
   a second inverter coupled intermediate the output of the divider circuit 30 and the second one shot circuit; and
   a combiner circuit configured to combine the pulse shaped signal with outputs of the first and second one shot circuits.

2. The circuit arrangement of claim 1, further comprising:
   a voltage regulator circuit configured to output a reduced supply voltage signal to the pulse shaping circuit based upon an input supply voltage signal; and
   a level shifter coupled intermediate an output of the pulse shaping circuit and the divider circuit and configured to level shift the pulse shaped signal based upon the input supply voltage signal.

3. A circuit arrangement, comprising a variable threshold, multi-stage pulse shaping circuit configured to receive an input signal that is responsive to a crystal oscillator circuit, the pulse shaping circuit including a plurality of stages, each stage including a latch and a Schmitt trigger coupled to an input of the latch, wherein the Schmitt trigger in each stage has a programmable trip point, and wherein a last stage among the plurality of stages outputs a pulse shaped signal based upon the input signal.

4. The circuit arrangement of claim 3, further comprising a voltage reference coupled to a trip control input of the Schmitt trigger in each stage to program the trip point for the respective Schmitt trigger.

5. The circuit arrangement of claim 3, wherein the crystal oscillator circuit is configured to receive an input supply voltage signal, and wherein the circuit arrangement further comprises a voltage regulator circuit coupled to receive the input supply voltage signal, the voltage regulator signal configured to provide a reduced supply voltage signal to the pulse shaping circuit.

6. The circuit arrangement of claim 5, further comprising a level shifter configured to level shift the pulse shaped signal based upon the input supply voltage signal.

7. The circuit arrangement of claim 3, wherein the latch in each stage of the pulse shaping circuit comprises an R-S latch.

8. The circuit arrangement of claim 7, wherein the Schmitt trigger in each stage of the pulse shaping circuit is coupled to a first input of the respective latch, and wherein each stage of the pulse shaping circuit further includes a delay and an inverter coupled intermediate the respective Schmitt trigger and a second input of the respective latch.

9. The circuit arrangement of claim 3, wherein the pulse shaping circuit comprises at least three stages.

10. The circuit arrangement of claim 9, wherein the pulse shaping circuit consists of four stages.

11. The circuit arrangement of claim 3, further comprising a divider circuit configured to frequency divide the pulse shaped signal.

12. The circuit arrangement of claim 11, further comprising:
a first one shot circuit coupled to an output of the divider circuit;
an inverter coupled to the output of the divider circuit; and
a second one shot circuit coupled to an output of the inverter.

13. The circuit arrangement of claim 12, further comprising an OR circuit configured to combine outputs of the first and second one shot circuits.

14. The circuit arrangement of claim 13, further comprising a second OR circuit configured to combine the pulse shaped signal with an output of the first OR circuit.

15. The circuit arrangement of claim 14, wherein an output of the second OR circuit is configured to provide a clock signal to an electronic circuit, and wherein each of the first and second one shot circuits is configured to output a pulse with a duration that is greater than a minimum duration to which the electronic circuit is responsive.

16. The circuit arrangement of claim 3, wherein the pulse shaping circuit is configured to receive the input signal from a transconductance input of the crystal oscillator circuit.

17. A method of pulse shaping a signal generated by a crystal oscillator circuit, the method comprising:
receiving an input signal that is responsive to the crystal oscillator circuit; and
generating a pulse shaped signal from the input signal using a variable threshold, multi-stage pulse shaping circuit that includes a plurality of stages, wherein each stage includes a latch and a Schmitt trigger coupled to an input of the latch, and wherein the Schmitt trigger in each stage has a programmable trip point.

18. The method of claim 17, further comprising programming the trip point for each Schmitt trigger using a voltage reference.

19. The method of claim 17, further comprising:
generating a reduced supply voltage signal for the pulse shaping circuit from an input supply voltage signal; and
level shifting the pulse shaped signal based upon the input supply voltage signal.

20. The method of claim 17, wherein the latch in each stage of the pulse shaping circuit comprises an R-S latch, wherein the Schmitt trigger in each stage of the pulse shaping circuit is coupled to a first input of the respective latch, and wherein each stage of the pulse shaping circuit further includes a delay and an inverter coupled intermediate the respective Schmitt trigger and a second input of the respective latch.

21. The method of claim 17, further comprising:
frequency dividing the pulse shaped signal to generate a frequency divided signal;
outputting the frequency divided signal to first and second one shot circuits;
inverting the frequency divided signal output to the second one shot circuit; and
combining outputs of the first and second one shot circuits to generate a combined signal.

22. The method of claim 21, further comprising combining the combined signal with the pulse shaped signal to generate a second combined signal.

23. The method of claim 22, wherein the second combined signal is configured to be provided to an electronic circuit, and wherein each of the first and second one shot circuits is configured to output a pulse with a duration that is greater than a minimum duration to which the electronic circuit is responsive.

24. The method of claim 17, wherein the pulse shaping circuit is configured to receive the input signal from a transconductance input of the crystal oscillator circuit.

* * * * *